(12) United States Patent
Mukunoki

(10) Patent No.: US 7,330,374 B2
(45) Date of Patent: Feb. 12, 2008

(54) NONVOLATILE SEMICONDUCTOR MEMORY DEVICE, SUCH AS AN EEPROM OR A FLASH MEMORY, WITH REFERENCE CELLS

(75) Inventor: Toshio Mukunoki, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 15 days.

(21) Appl. No.: 11/402,011

(22) Filed: Apr. 12, 2006

(65) Prior Publication Data
US 2006/0239093 A1    Oct. 26, 2006

(30) Foreign Application Priority Data
Apr. 12, 2005   (JP)   ............... P2005-114163

(51) Int. Cl.
    G11C 16/28   (2006.01)
    G11C 16/02   (2006.01)
    G11C 7/14    (2006.01)
(52) U.S. Cl. .............. 365/185.2; 365/210; 365/185.21; 365/207; 365/185.24; 365/189.07
(58) Field of Classification Search .............. 365/185.2, 365/185.21, 185.24, 189.07, 207, 210
    See application file for complete search history.

(56) References Cited

U.S. PATENT DOCUMENTS

| 5,163,021 | A  | * | 11/1992 | Mehrotra et al. | ...... 365/185.03 |
| 5,812,457 | A  | * | 9/1998  | Arase           | ............ 365/185.22 |
| 6,269,022 | B1 |   | 7/2001  | Ra              | |
| 6,449,190 | B1 | * | 9/2002  | Bill            | ............... 365/185.2 |
| 6,584,017 | B2 | * | 6/2003  | Maayan et al.   | ........ 365/185.22 |
| 6,912,161 | B2 |   | 6/2005  | Hirano et al.   | |
| 2004/0130943 | A1 | * | 7/2004 | Hirano et al.  | .......... 365/185.01 |

FOREIGN PATENT DOCUMENTS

JP    2004-39075 A    2/2004

* cited by examiner

*Primary Examiner*—J. H. Hur
(74) *Attorney, Agent, or Firm*—McDermott Will & Emery LLP

(57) ABSTRACT

To set a threshold of a reference cell in short time in a semiconductor memory device using a variable threshold type nonvolatile memory cell as a reference current/voltage generating unit, a memory cell which keeps an initial state during an inspection process without performing write/erase operations is provided in an area of a memory cell storing data, and Vt setting of a reference cell is performed while the verification of the reference cell is performed on the basis of the memory cell which keeps the initial state during the inspection process.

6 Claims, 17 Drawing Sheets

INITIAL STATE

AFTER Vt SETTING OF REFERENCE CELL

AFTER E/W INSPECTION AND HIGH-TEMPERATURE STORAGE

INITIAL STATE

AFTER Vt SETTING OF REFERENCE CELL

AFTER E/W INSPECTION AND HIGH-TEMPERATURE STORAGE

INITIAL STATE

AFTER Vt SETTING OF REFERENCE CELL

AFTER E/W INSPECTION AND HIGH-TEMPERATURE STORAGE

0/1 JUDGMENT COUNT WHEN INITIAL Vt SETTING 0:2Kbit,1:2Kbit

0/1 JUDGMENT COUNT WHEN INITIAL Vt SETTING 0:2Kbit,1:2Kbit

NONVOLATILE SEMICONDUCTOR MEMORY DEVICE, SUCH AS AN EEPROM OR A FLASH MEMORY, WITH REFERENCE CELLS

BACKGROUND OF THE INVENTION

1. Field of the Invention

The present invention relates to a nonvolatile semiconductor memory device, such as an EEPROM (Electrically Erasable and Programmable Read Only Memory) or a flash memory, having memory cells for storing data by the amount of an electrostatic charge on a channel of a transistor. These memories can hold data when power is not supplied.

2. Description of the Related Art

Semiconductor memory devices for storing data with elements integrated on a semiconductor substrate are broadly divided into two kinds of volatile memories which can hold data only when power is supplied, and nonvolatile memories which can hold data when power is not supplied. These memories are further divided according to methods or uses. At present, of the nonvolatile memories, a flash EEPROM which can be electrically writable and erasable has been widely used. As a device for the flash EEPROM, there has been known a floating memory cell which has a floating gate formed on a channel of a MOS transistor, a periphery of which is insulated by an oxide film or the like. Such a floating memory cell changes a gate threshold voltage (hereinafter, referred to as Vt), with which a source-to-drain current of the MOS transistor starts to flow, by injecting or releasing electrons into or from the floating gate, thereby storing data.

FIG. 19 is a cross-sectional view of a stacked flash EEPROM memory cell which is widely used at present. There is disclosed a transistor structure which has a floating gate FG and a control gate CG for potential control formed on a substrate Sub, and a source S and a drain D arranged at both ends. Further, an ONO film is formed between the control gate CG and the floating gate FG, and a $SiO_2$ film with little crystal defect formed by thermal oxidization is formed between the floating gate FG and the substrate Sub. In an actual memory array, multiple memory cells are successively arranged in vertical and horizontal directions on a semiconductor substrate, and a potential Vg, Vs or Vd is supplied to the control gates CG, the sources S or the drains D by word lines WL, source lines or bit lines.

FIG. 20 schematically shows a peripheral portion of a memory array of a conventional flash EEPROM. Further, FIG. 21 is a circuit diagram showing the inner parts of a memory array 101 or a reference cell 105 of FIG. 20. As shown in FIG. 21, the memory array 101 has a plurality of memory cells M00 to Mnm in an array shape in vertical and horizontal directions, and the control gates of the memory cells are correspondingly connected to the word lines WL0 to WLn. Each of the word lines WL0 to WLn serves as a common node for the memory cells horizontally arranged. For example, the control gates of the memory cells M00, M01, M02, . . . , and M0m are connected to the word line WL0. Further, the drains of the memory cells are correspondingly connected to the bit lines BL1 to BLm. Each of the bit lines BL1 to BLm serves as a common node for the memory cells vertically arranged. For example, the drains of the memory cells M01, M11, M21, . . . , and Mn1 are connected to the bit line BL1. Further, these cells are also connected to the source line SL0 simultaneously. The word lines, the bit lines, and the source lines can supply potentials by a row decoder 102 and a column decoder 103 shown in FIG. 20.

In FIG. 21, a reference cell R0, which generates a voltage or current to be a judgment reference when data is read out from each of the memory cells M00 to Mnm, is connected to a word line RWL and a source line RSL, like the memory cells. Further, the reference cell R0 is also connected to a sense amplifier SA through a bit line RBL. As the reference cell R0, the same nonvolatile memory (flash EEPROM) as the memory cell, not a CMOS transistor, is used. In general, the voltage or current to be the reference requires high accuracy, and thus an allowable range of a variation in characteristic for the reference cell which generates the voltage or current to be the reference is narrow. When a CMOS transistor is used for the reference cell, a manufacturing variation in characteristic inevitably occurs. This variation leads to a reduction in yield and an increase in chip area due to an advanced circuit design for increasing the allowable range of the variation in characteristic. In contrast, when the nonvolatile memory is used, it is possible to meet the manufacturing variation in characteristic of the reference cell through the Vt adjustment of the reference cell at the time of inspection. Therefore, unlike the above-described case, the reduction in yield or the increase in chip area does not occur. In addition, a variation in characteristic of a reading circuit such as a sense amplifier can be adjusted by the reference cell using a nonvolatile memory, and thus a larger operation margin or enhancement of a specification can be expected. It is desirable to reduce an inspection cost of a memory device using a nonvolatile memory, like a memory cell, for the reference cell.

For the inspection of the nonvolatile memory, in general, screening which involves high-temperature storage is executed to assure data holding characteristics. FIG. 22 is a schematic view showing an inspection flow of a conventional memory device. In this case, after the optimum value of Vt of the reference cell is set, the writing/erasure/reading inspection and the high-temperature storage are performed in sequence. At that time, since high-temperature stress is applied to the nonvolatile memory used as the reference cell, Vt is changed. In order to perform the inspection after the application of the stress, it is necessary to correct the Vt change (restore Vt to the set value at the beginning of the inspection).

FIG. 23 is a flowchart showing a method of setting and restoring initial Vt of the reference cell of the conventional memory device. A cell current is first measured, and then, the measured value of the cell current is different from a desired current value, a bias voltage is applied to the reference cell so as to change Vt of the reference cell (hereinafter, this operation is referred to as a write operation into the reference cell). The cell current measurement and the write operation are repeated until the measured value of the cell current reaches the desired cell current value. A current of the reference cell when initial Vt setting is completed is stored, and, at the time of the Vt restoration, the cell current measurement and the write operation are repeated until the measured value of the cell current is equal to the stored current value.

Moreover, JP-A-2004-39075 is an example of the related art.

However, as described above, the characteristics of the reference cell should have high accurate, and thus it is necessary to accurately restore Vt of the reference cell to Vt at the time of initial setting. For this reason, the verification by the current of the reference cell should be repeated by performing the write operation under the low bias voltage condition, and by gradually changing Vt. In general, since it takes much time for the current measurement, the repetition of the current measurement plural times causes an increase in inspection time and product cost. An object of the invention is to reduce time required for a Vt restoration to be repeatedly performed during an inspection process. Further, another object of the invention is to reduce time required for initial Vt setting of a reference cell.

SUMMARY OF THE INVENTION

In order to solve the above-described problems, in embodiments of the invention, a nonvolatile memory cell in an initial state after rod end is used as a reference of a reference cell.

As for the Vt restoration when the threshold of the reference cell is changed during the inspection process, the verification by the measurement of the reference cell current, which requires a long inspection time, can be eliminated, and thus the repetitive write operation of the reference cell can be completed in short time. Therefore, the inspection time can be markedly reduced and the cost can be reduced.

DESCRIPTION OF THE PREFERRED EMBODIMENTS

First Embodiment

Figure 1:
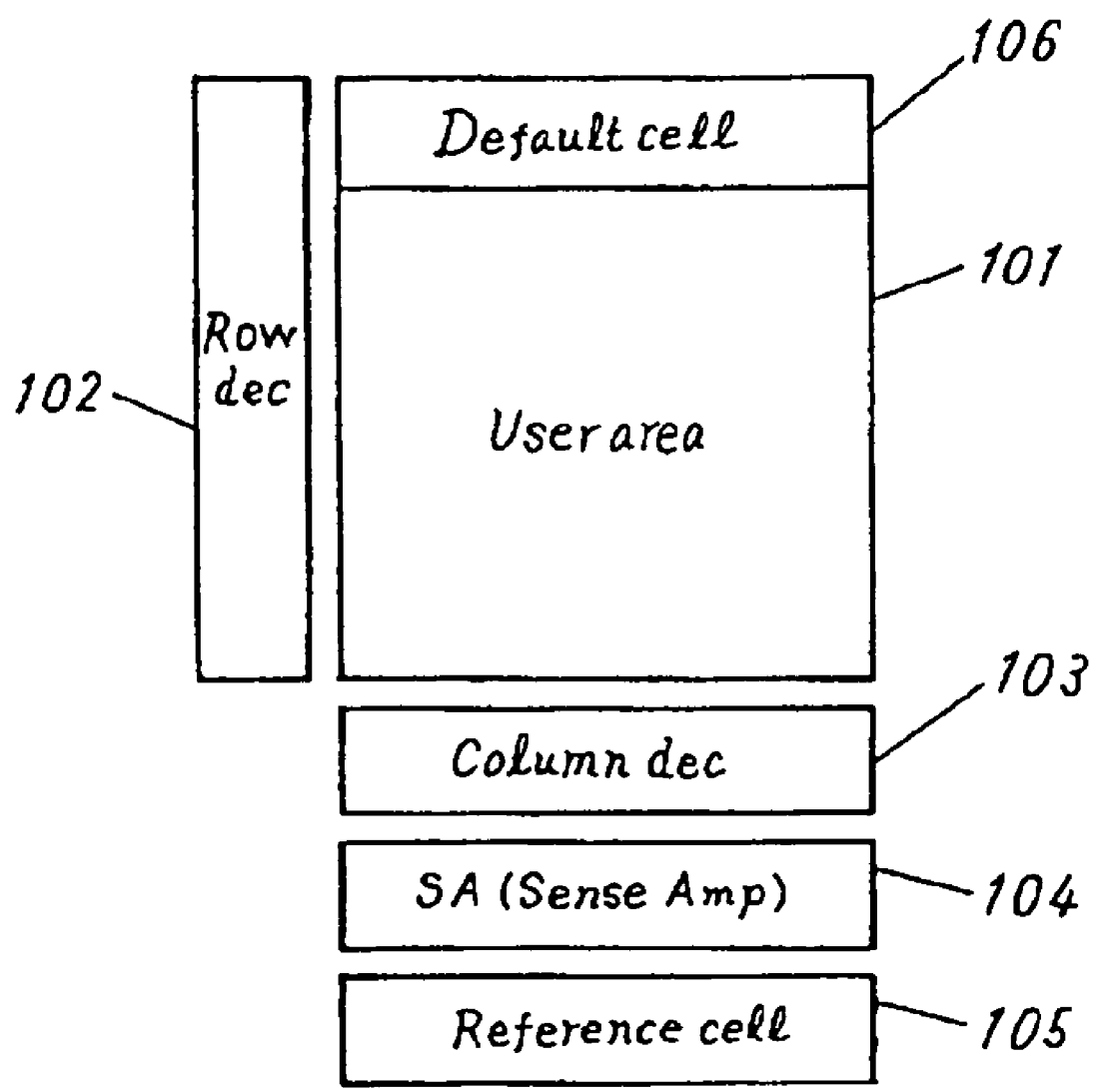
FIG. 1 is a block diagram of a memory cell array according to a first embodiment of the invention.
Figure 2:
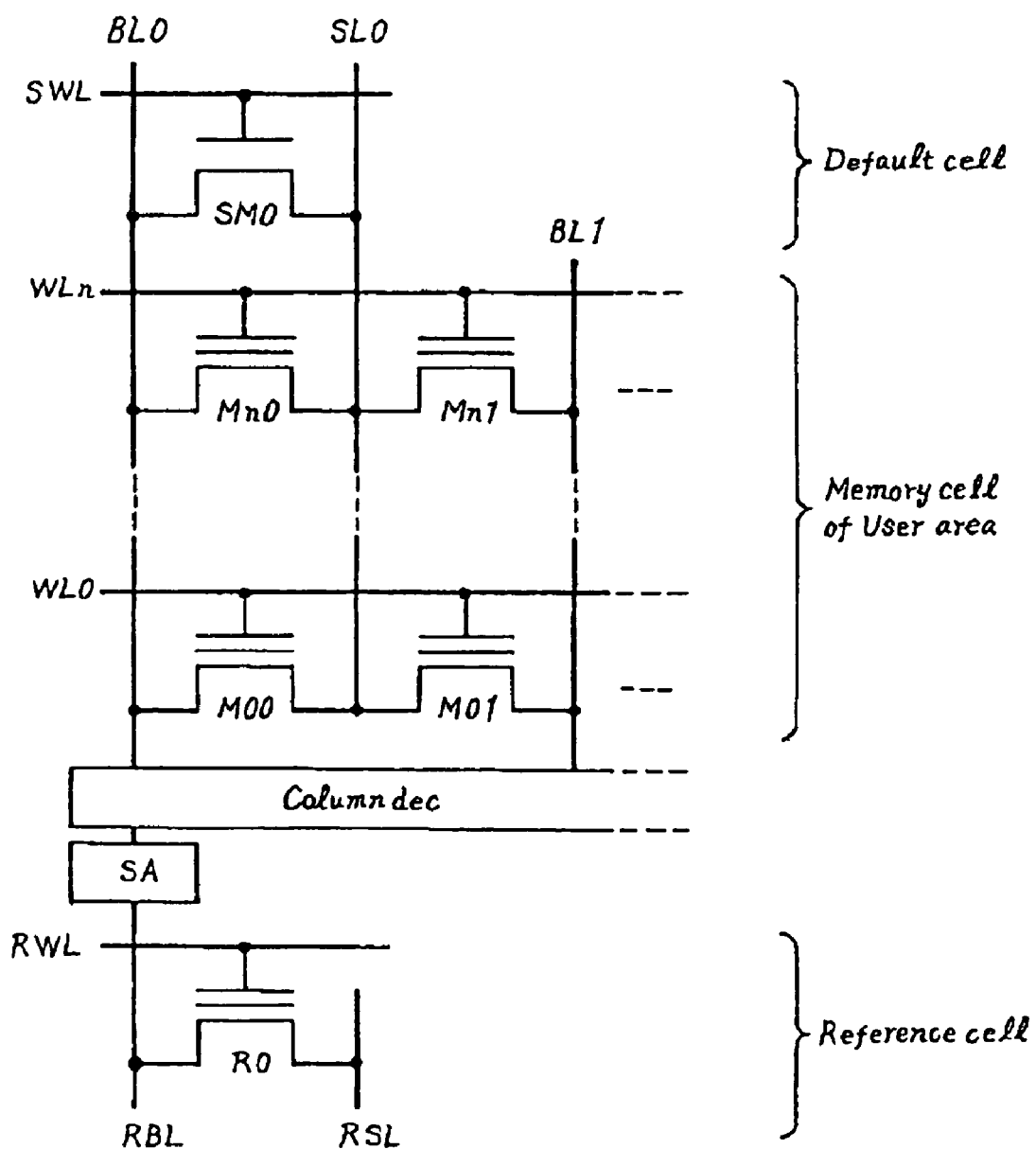
FIG. 2 is a structural view of the array according to the first embodiment of the invention.
Figure 3A:
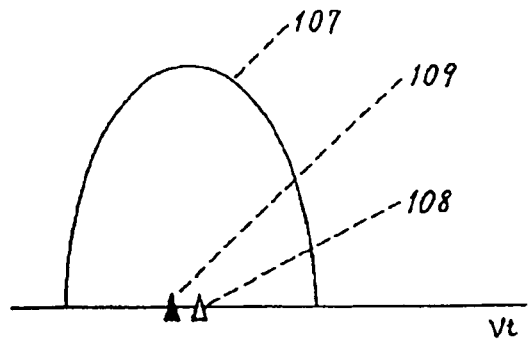
FIGS. 3A to 3C are diagrams showing a Vt distribution according to the first embodiment of the invention.
Figure 3B:
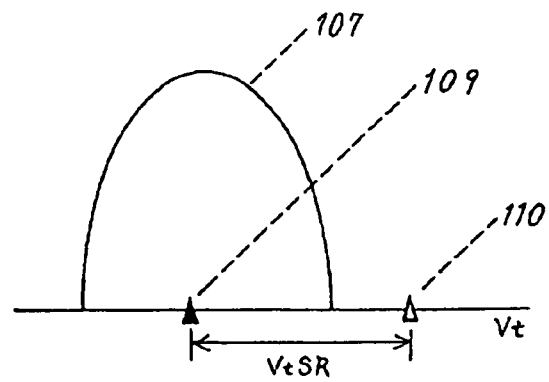
Figure 3C:
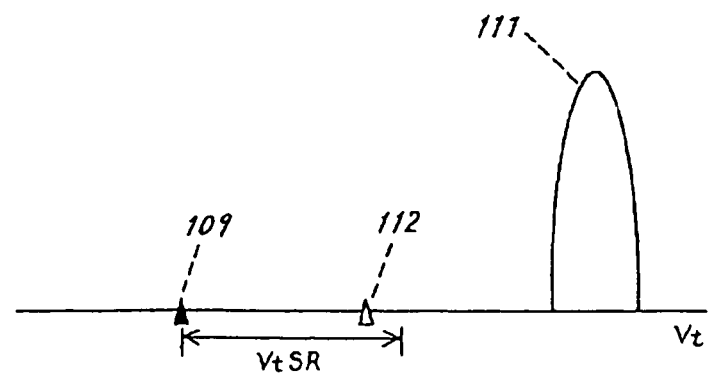
Figure 4:
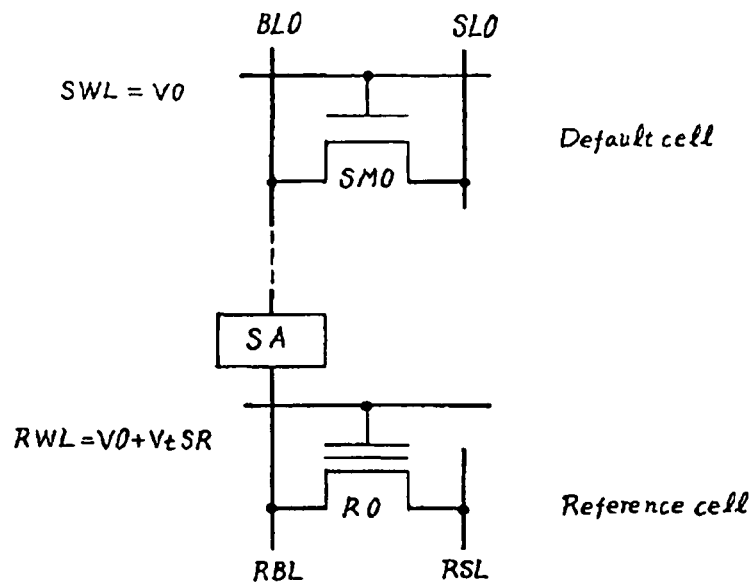
FIG. 4 is a diagram showing parts required for Vt setting of a reference cell according to the first embodiment of the invention.
Figure 5A:
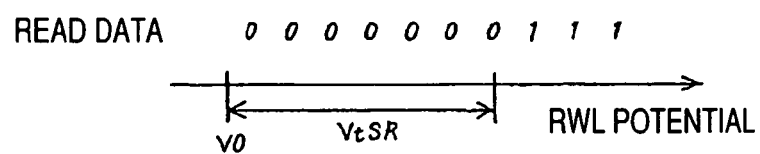
FIGS. 5A and 5B are diagrams showing a Vt difference measurement method and a Vt restoration method on the basis of the Vt difference measurement method according to the first embodiment of the invention.
Figure 5B:
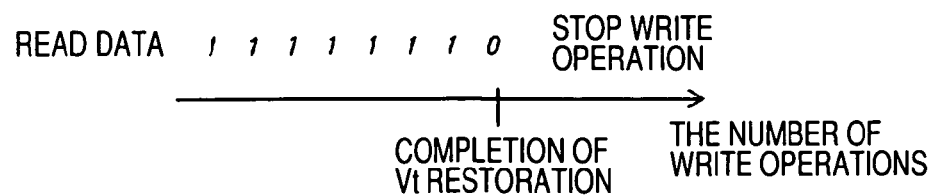
Figure 20:
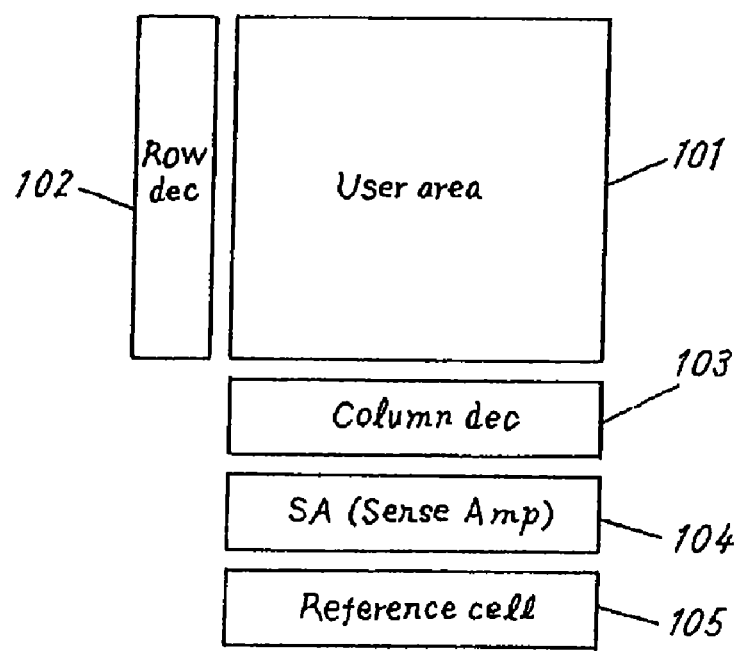
FIG. 20 is a block diagram of a conventional memory cell array.
Figure 21:
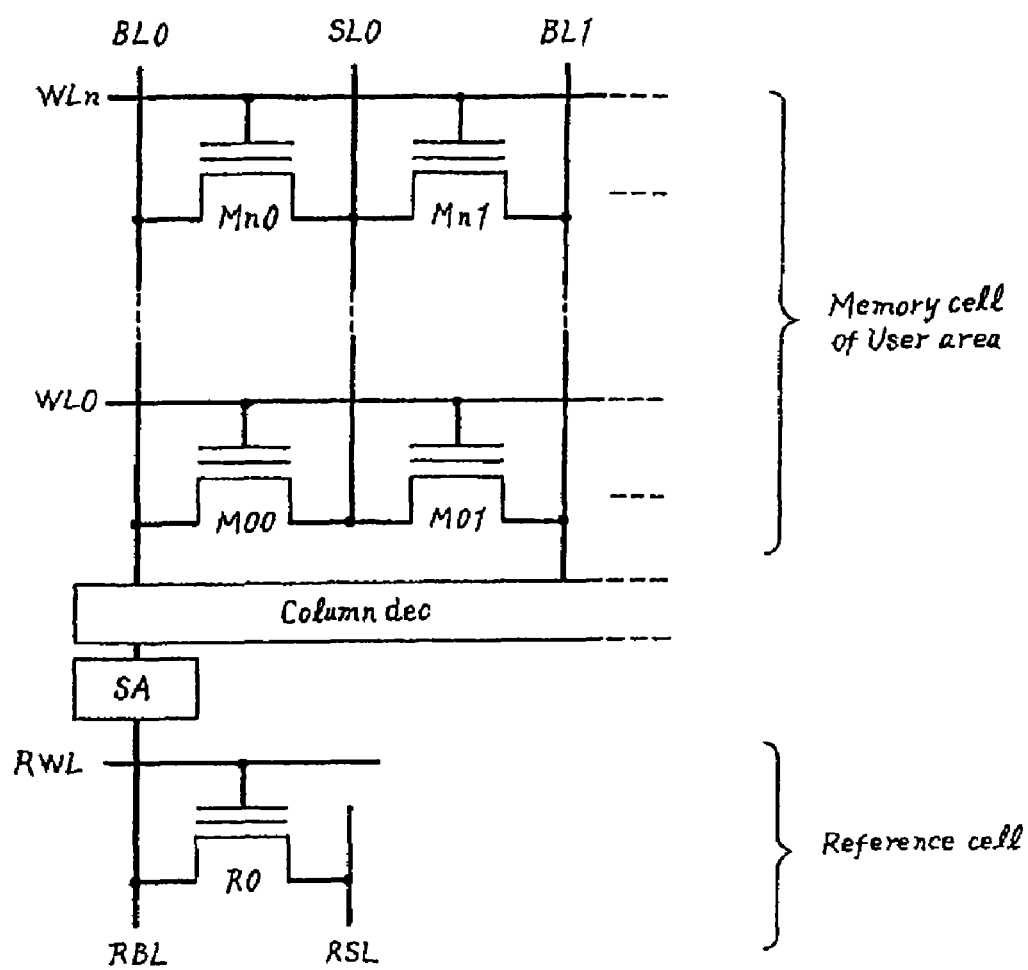
FIG. 21 is a structural view of the conventional memory cell array.
Figure 22:
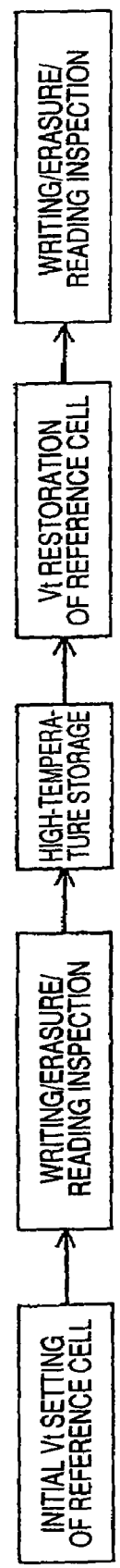
FIG. 22 is an inspection process view of a conventional memory device.
Figure 23:
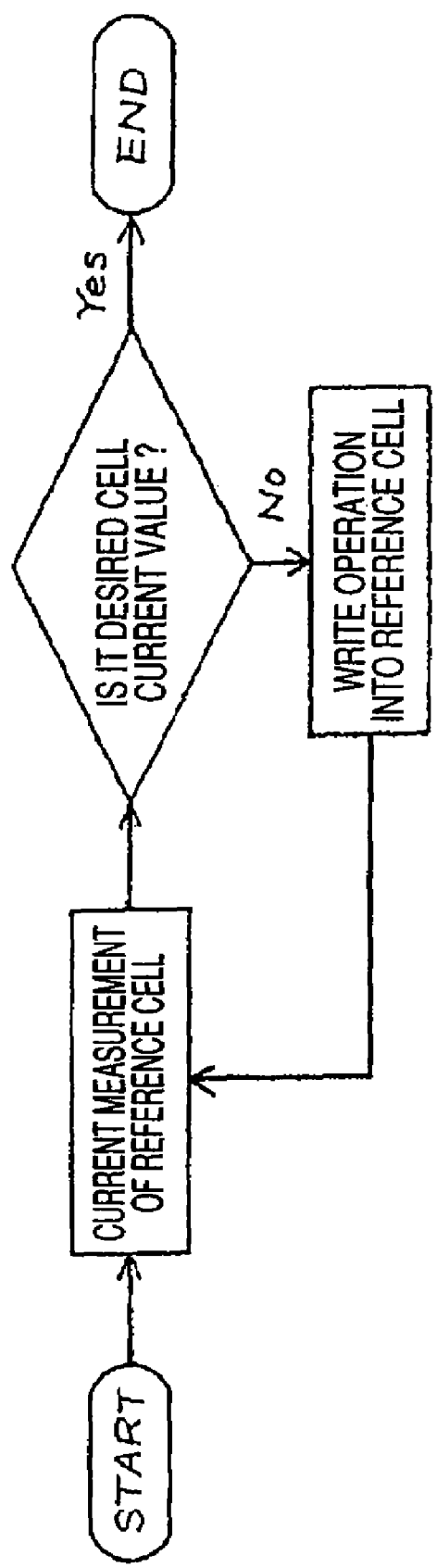
FIG. 23 is a flowchart showing a Vt restoration method of a reference cell of the conventional memory device.

FIG. 1 schematically shows a peripheral portion of a memory array of a flash EEPROM according to a first embodiment of the invention. FIG. 2 is a circuit diagram showing the inner parts of a memory array 101, a reference cell 105, or a default cell 106 of FIG. 1. As shown in FIG. 2, a control gate of a default cell SM0 is connected to a word line SWL for a default cell, and a drain and a source of the default cell SM0 are connected to a bit line BL0 and a source line SL0, respectively. Moreover, the same parts as those in FIGS. 20 and 21 are represented by the same reference numerals, and the descriptions thereof will be omitted. FIGS. 3A to 3C show the Vt distribution of the memory cell of a memory array (user area) 101, and the Vt changes of the reference cell 105 and the default cell 106 during an inspection process. FIG. 4 shows parts required for Vt setting of a reference cell R0 and extracted from FIG. 2. FIGS. 5A and 5B show a Vt difference measurement method and a Vt restoration method on the basis of the Vt difference measurement method.

Figure 19:
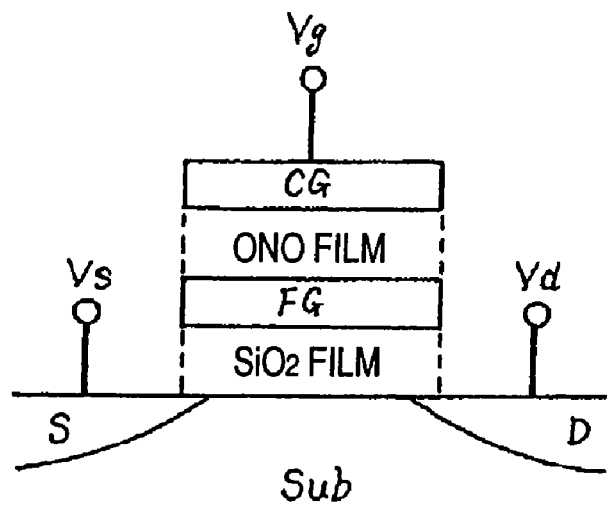
FIG. 19 is a structural view of a conventional memory cell device.

With reference to FIGS. 1 to 5B, a description will be given for the Vt restoration method of the reference cell by using the memory device according to the first embodiment of the invention. Moreover, in all embodiments of the invention, descriptions will be given by way of a stacked floating gate-type flash EEPROM memory shown in FIG. 19. However, the invention can be applied to all nonvolatile memories which store data on the basis of the Vt change, in addition to the device shown in the drawings, regardless of a difference in cell structure of an MNOS (Metal-Nitride-Oxide-Silicon) type nonvolatile memory and the like.

As shown in FIG. 2, the use of the default cell SM0 is not permitted for a user. For this reason, it is not necessary to assure writing/erasing characteristics, the default cell SM0 can keep the initial state during the inspection process without performing the write and erase operations. In order to make the default cell SM0 keep the initial state, it is preferably configured such that a special operation is required for the access to the default cell SM0. For example, the address assignment may be executed by an input through terminals or a design specification of setting a special register inside the chip or the like. On the other hand, in order to assure the writing/erasing characteristics, in memory cells M00 to Mnm of the user area, the write and erase operations are performed during the inspection process. The invention lays emphasis on a difference in handling method for the areas.

As shown in FIGS. 3A to 3C, Vt 109 of the default cell SM0 which does not perform the write and erase operations keeps the same value. This is because the write and erase operations are not performed to change Vt and the write and erase operations are not performed under the high-temperature storage, such that the default cell SM0 keeps a neutral state where a charge does not exist. In this case, the charge is not injected or released, and Vt 109 leaves unchanged. In contrast, in case of Vt 112 of the reference cell after the write operation, since the charge exists in the reference cell R0, the Vt change occurs. The difference in characteristic is used for the Vt restoration of the reference cell.

A description will now be given in sequence. First, the default cell SM0 is arranged to correspond to the reference cell R0, and the Vt difference after the write operation into the reference cell of FIG. 3B is measured and stored. As a specific method, as shown in FIGS. 4 and 5A, a potential difference is provided between the word line SWL of the default cell SM0 and the word line RWL of the reference cell R0, and then a read operation is performed so as to measure the Vt difference of each cell. That is, in a state where a predetermined potential V0 is applied to the word line SWL with the default cell SM0 as a reference, the read operation of date of the reference cell is performed while changing the potential of the word line RWL of the reference cell. The potential difference between the word lines SWL and RWL when data is changed is set to a VtSR difference of each cell. The VtSR difference is stored in a file of a tester or a special nonvolatile memory area inside the chip. At the time of the Vt restoration, like the case where the Vt difference is measured, the potential V0 is applied to the word line SWL, and a potential which is larger than the potential V0 by the VtSR difference between the default cell SM0 and the reference cell R0 is applied to the word line RWL. Then, the write operation into the reference cell is performed until read data is 0, as shown in FIG. 5B, such that the Vt restoration of the reference cell is performed.

As such, since the write or erase operation is not performed on the default cell SM0, the default cell SM0 is in the neutral state where the charge is not accumulated, and thus Vt leaves unchanged under high-temperature stress. Therefore, the Vt distribution keeps the initial state. The Vt restoration of the reference cell is performed on the basis of the stored Vt difference with respect to Vt of the default cell SM0. Accordingly, the verification at the time of the write operation into the reference cell is performed by using a sense amplifier SA, in addition to the current measurement through the tester. Therefore, it is possible to completely perform the Vt restoration at high speed.

Further, as an additional method, the voltage of the word line RWL of the reference cell R0 may be constant, and the voltage of the word line SWL of the default cell SM0 may be changed. In this case, the same result can be obtained. At that time, the voltage of the word line of the reference cell may be adjusted such that the current of the reference cell close to a normal write operation flows. Therefore, the stable measurement of the Vt difference and the Vt restoration of the reference cell can be performed.

Further, in view of design, the initial value of Vt of the default cell SM0 or the reference cell R0 tends to converge around the center of the entire distribution of the memory cell. By use of the convergence, the method of this embodiment can be used for initial Vt setting of the reference cell.

Further, with the reduction of the manufacturing variation in characteristic or the enhancement of reliability, if the writing/erasing characteristics of the memory cell can be assured without performing the write/erase operation, an area of the memory cell which is permitted to be used by the user can be used as the above-described default cell SM0.

Second Embodiment

Figure 6:
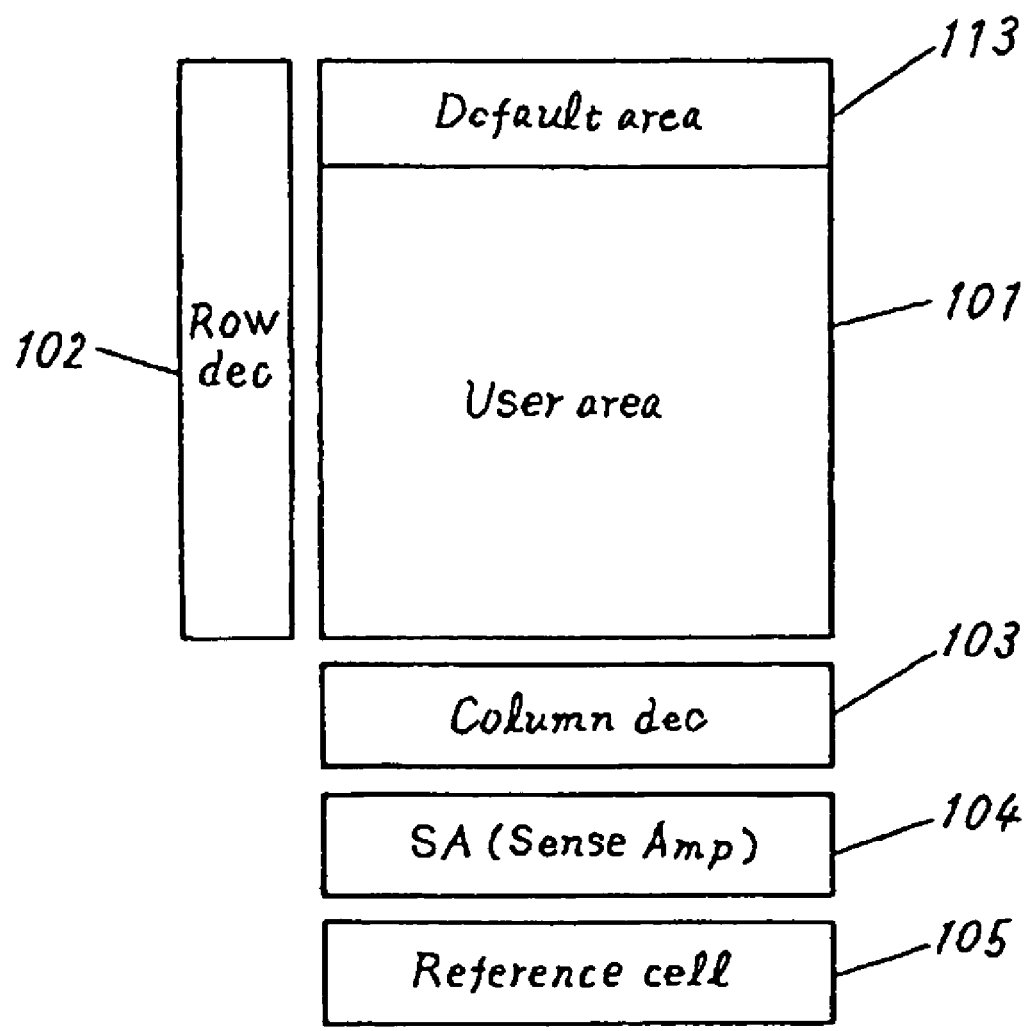
FIG. 6 is a block diagram of a memory cell array according to a second embodiment of the invention.
Figure 7:
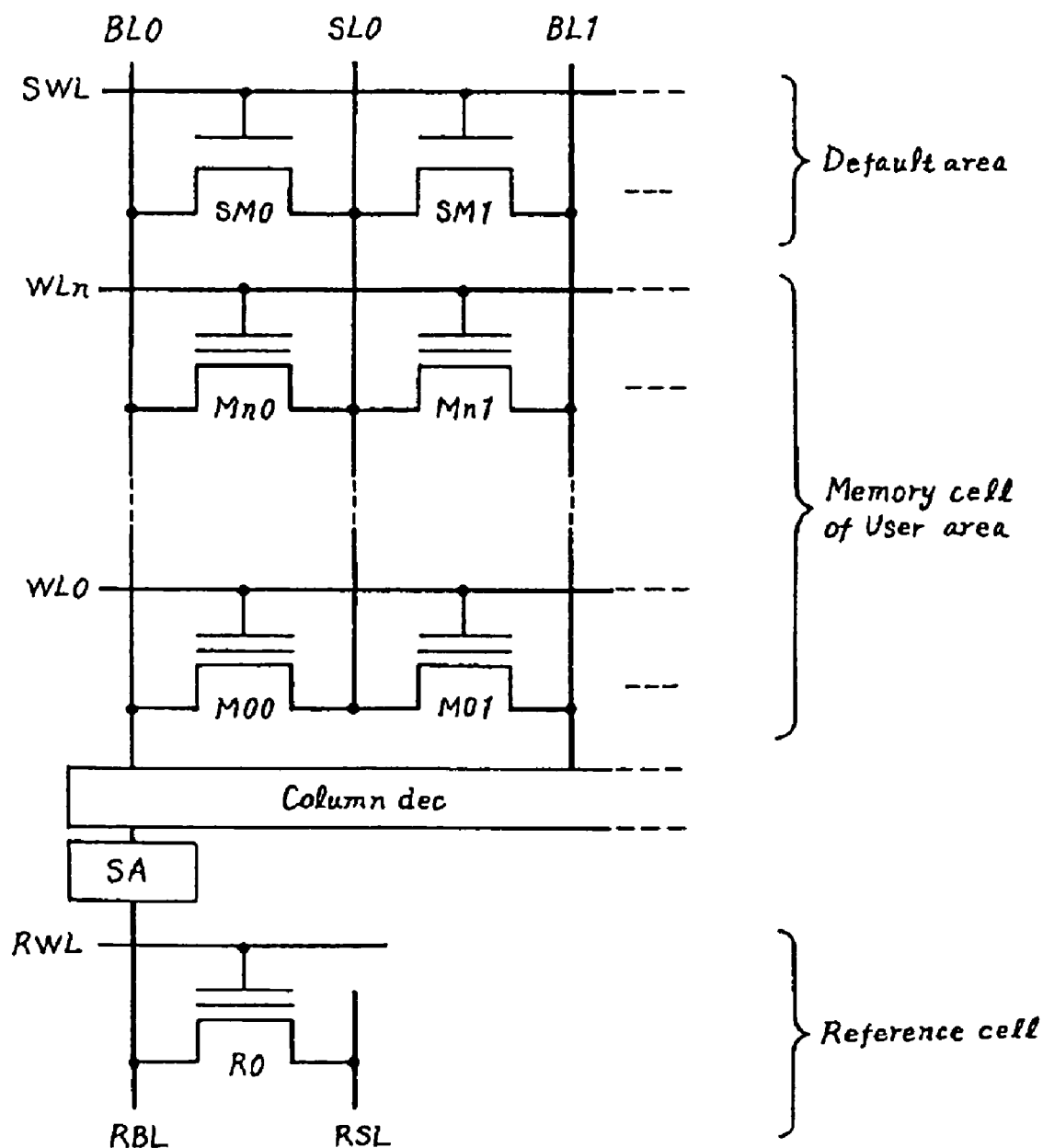
FIG. 7 is a structural view of the array according to the second embodiment of the invention.
Figure 8A:
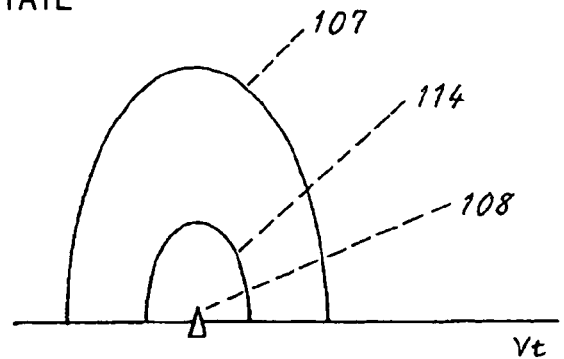
FIGS. 8A to 8C are diagrams showing a Vt distribution according to the second embodiment of the invention.
Figure 8B:
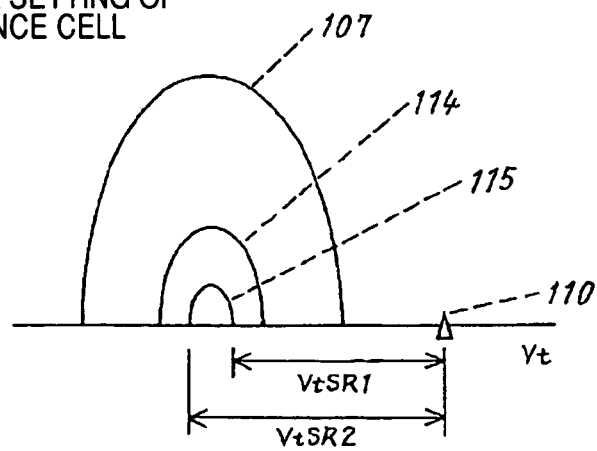
Figure 8C:
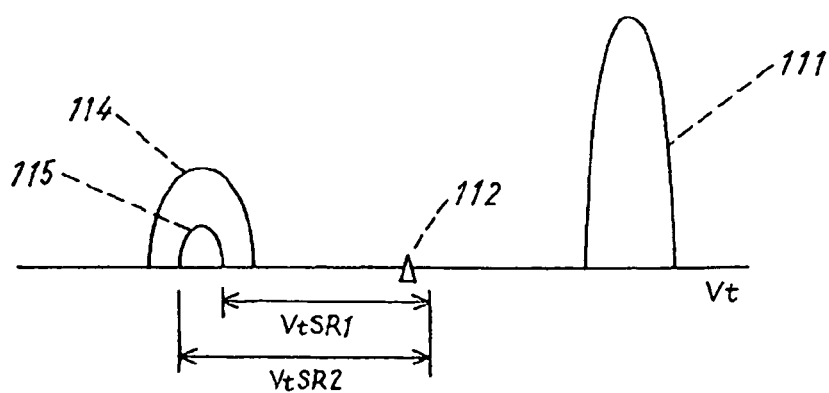
Figure 9:
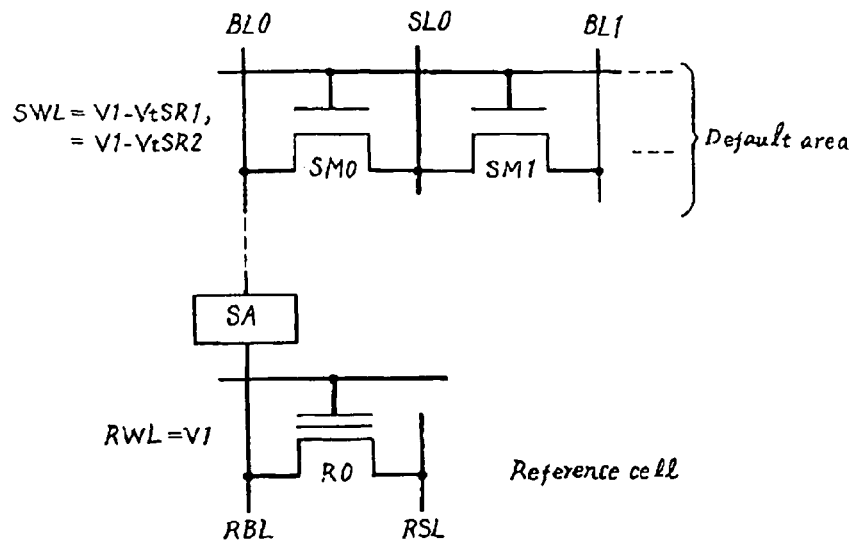
FIG. 9 is a diagram showing parts required for Vt setting of a reference cell according to the second embodiment of the invention.
Figure 10A:
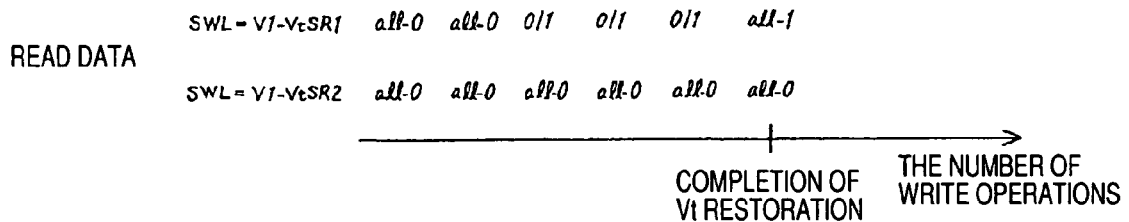
FIGS. 10A and 10B are diagrams showing a Vt restoration method according to the second embodiment of the invention.
Figure 10B:
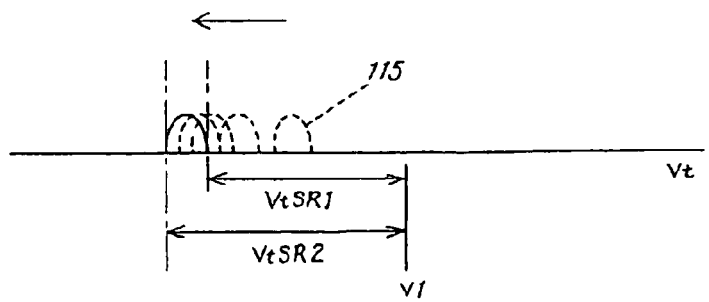
Figure 11:
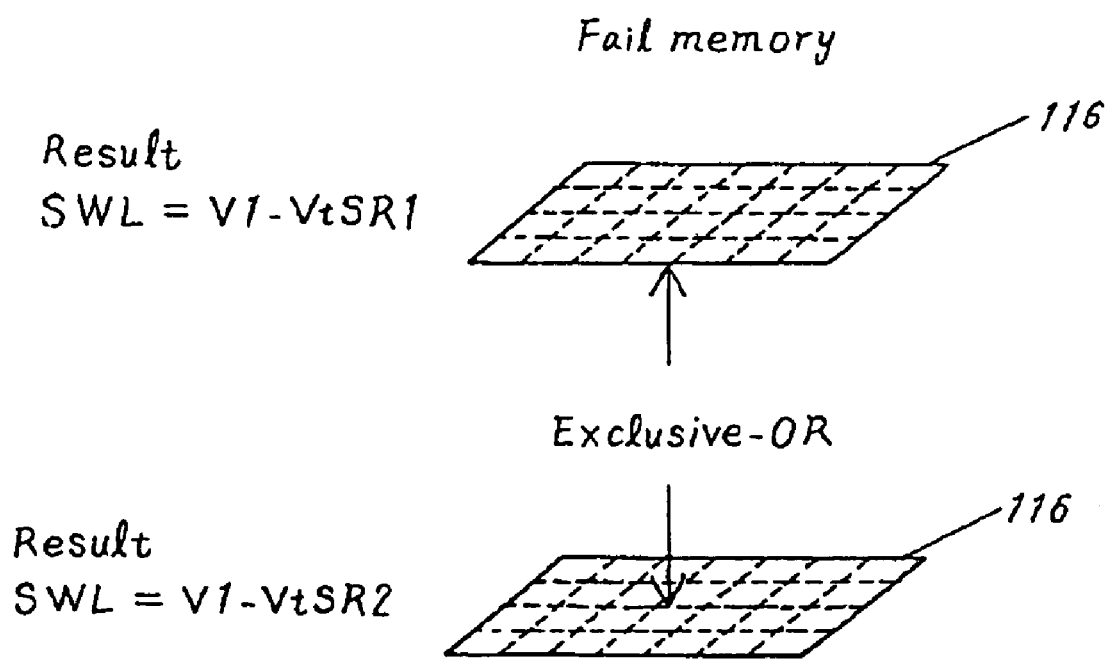
FIG. 11 is a diagram showing an examination method of memory cells having Vt in a specific range according to the second embodiment of the invention.

FIG. 6 schematically shows a peripheral portion of a memory array of a flash EEPROM according to a second embodiment of the invention. FIG. 7 is a circuit diagram showing the inner parts of a memory-array 101 of a user area, a reference cell 105, or a memory array 113 of a default area of FIG. 6. In this embodiment, unlike the first embodiment, there is provided the memory array 113 of the default area where multiple default cells exist. As shown in FIG. 7, control gates of the default cells SM0, SM1, . . . , SMm are connected to a word line SWL for a default cell, and drains and sources of the default cells SM0 to SMm are correspondingly connected to bit lines and source lines. In FIG. 7, only the default cells for one word line are shown, but this is just an example. For example, the memory array of the default area may have a plurality of word lines for a default cell and default cells arranged in a matrix shape. Further, the same parts as those in FIGS. 20 and 21 are represented by the same reference numerals, and the descriptions thereof will be omitted. FIGS. 8A to 8C show the Vt distribution of the memory cell of the memory array (user area) 101, and the changes of Vt of the reference cell 105 and the Vt distribution of the default cell of the memory array (default area) 113 during the inspection process. FIG. 9 shows parts required for Vt setting of a reference cell R0 and extracted from FIG. 7. FIGS. 10A, 10B and 11 show a measurement method of the memory cell of the default area where the Vt difference with the reference cell R0 is in a specified range, and a Vt restoration method on the measurement method.

With reference to FIGS. 6 to 11, a description will be given for the Vt restoration method of the reference cell using the memory device according to the second embodiment of the invention. Like the first embodiment, the use of the default cells of the default area 113 is not permitted for the user. For this reason, it is not necessary to assure the writing/erasing characteristics, and the default cells can keep the initial states during the inspection process without performing the write and erase operations. Therefore, as shown in FIGS. 8A to 8C, the Vt distribution 114 of the memory array (default area) 113 where the write and erase operations are not performed keeps the same value. Of these, paying attention to the default cell having Vt in a specified range, the Vt restoration of the reference cell is performed based on a plurality of default cells in that range.

A description will now be given in sequence. First, a plurality of default cells of the memory array (default area) 113 having Vt in the specified range are arranged to correspond to the reference cell R0. As a specific method, as shown in FIG. 9, two kinds of potential differences VtSR1 and VtSR2 are provided for the word line SWL of the default cells of the memory array (default area) 113 and the word line RWL of the reference cell R0, and the read operation is performed two times. Then, the results of the read operations are stored, for example, in a fail analysis memory 116, as shown in FIG. 11, and cells having different results of data judgment with the two kinds of the potential differences VtSR1 and VtSR2 are turned out on the basis of the exclusive logical sum of the results of the read operations. These memory cells are cells having the Vt difference with the reference cell R0 between VtSR1 and VtSR2. Referring to FIG. 8B, these memory cells are disposed within the Vt distribution of the cells to be the reference of Vt of the reference cell in the default area. The addresses of these cells are stored in a file of a tester or a special nonvolatile memory area in the chip.

At the time of the Vt restoration, like after the initial Vt adjustment of the reference cell R0, as shown in FIG. 9, the two kinds of the potential differences VtSR1 and VtSR2 are provided for the word line SWL of the default cells of the memory array (default area) 113 and the word line RWL of the reference cell R0. Then, the read operation is performed only on memory cells corresponding to the addresses of the cells having the Vt difference with the reference cell R0 between VtSR1 and VtSR2. Until the result, that is, the result when the potential of the word line SWL of the default cell is V1-VtSR1, becomes All-1, as shown in FIG. 10A, the write operation into the reference cell is performed, and thus the Vt restoration of the reference cell is performed. At this time, it should be noted that the result of the read operation when the potential of the word line SWL of the default cell is V1-VtSR2 keeps All-0. If 1 is mixed into the judgment result, it means that excessive write operations to the reference cell R0 are performed. Relatively speaking about these operations, as shown in FIG. 10B, the write operation into the reference cell R0 is performed such that the Vt distribution of the default area having Vt apparently increased due to the Vt reduction of the reference cell R0 returns to the value at the time of initial Vt setting of the reference cell R0.

Moreover, the above description has been given on an assumption that Vt of the reference cell R0 falls by the high-temperature storage. However, when Vt rises, the same Vt restoration can be performed by reversing the expected values.

As such, the use of a plurality of default cells to be the reference results in enhancement of accuracy of the Vt restoration. Like the first embodiment, when one cell is used, resolution becomes the steps of the voltage of the word line. When Vt is changed by the voltage applied from the outside, it takes much time. On the other hand, when Vt is changed internally, accuracy is degraded since fine steps are not formed. In contrast, according to the second embodiment, the problems regarding accuracy in the first embodiment can be solved by the use of a plurality of cells.

Third Embodiment

Figure 12A:
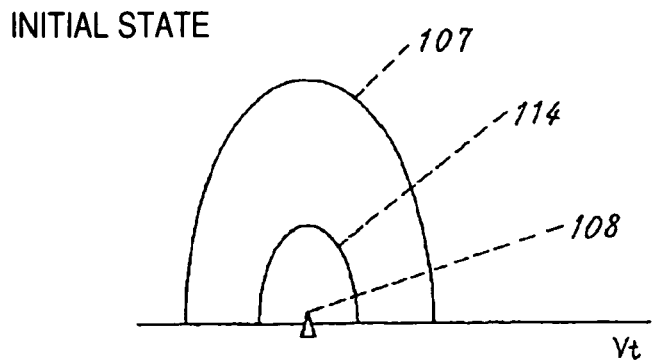
FIGS. 12A to 12C are diagrams showing a Vt distribution according to the third embodiment of the invention.
Figure 12B:
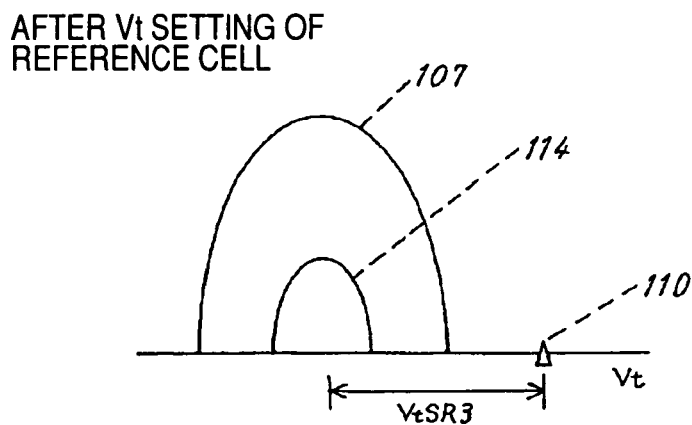
Figure 12C:
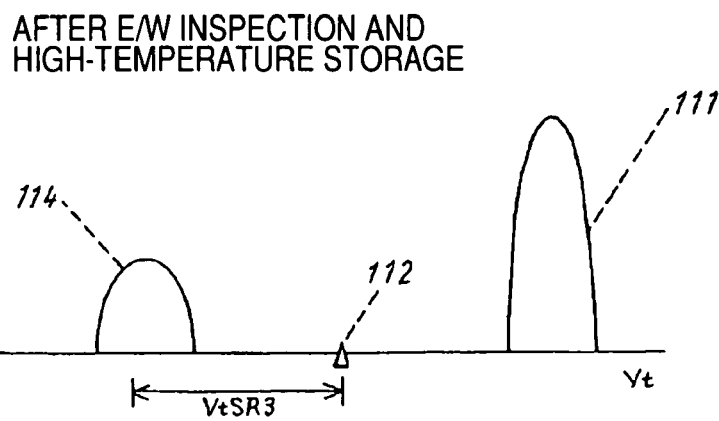
Figure 13:
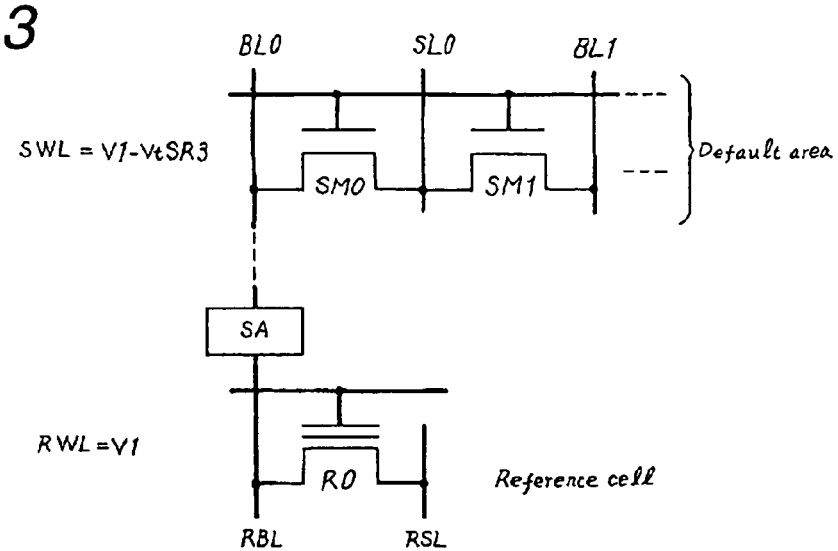
FIG. 13 is a diagram showing parts required for Vt setting of a reference cell according to the third embodiment of the invention.
Figure 14A:
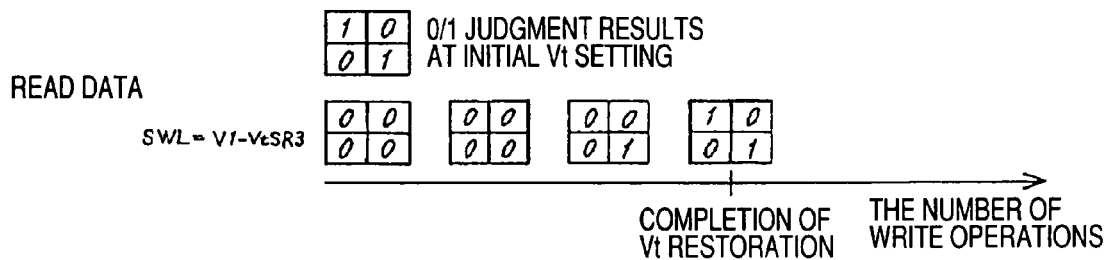
FIGS. 14A and 14B are diagrams showing a Vt restoration method according to the third embodiment of the invention.
Figure 14B:
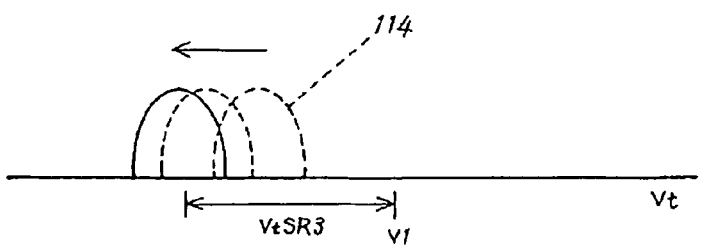
Figure 15:
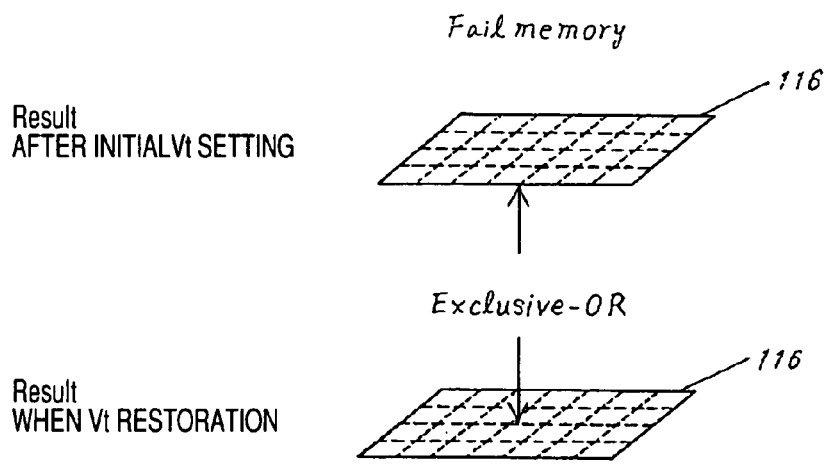
FIG. 15 is a diagram showing a comparison method of 0/1 judgment results according to the third embodiment of the invention.

FIGS. 12A to 12C show the Vt distribution of the memory cell of the memory array (user area) 101, and the changes of Vt of the reference cell 105 and the Vt distribution of the default cell of the memory array (default area) 113 during the inspection process according to a third embodiment. FIG. 13 shows parts required for Vt setting of the reference cell R0 and extracted from FIG. 7. FIGS. 14A, 14B, and 15 show a Vt restoration method. Moreover, the configuration is the same as that of the second embodiment, and thus the schematic view of the peripheral portion of the memory array and the circuit diagram of the inner parts of the blocks in the schematic view are the same as FIGS. 6 and 7 of the second embodiment, respectively.

With reference to FIGS. 12A to 15, a description will be given for a Vt restoration method using a memory device according to the third embodiment of the invention. Like the second embodiment, the default cells of the default area 113 keep the initial states during the inspection process without performing the write and erase operations. Therefore, as shown in FIGS. 12A to 12C, the Vt distribution 114 of the memory array (default area) 113 where the write and erase operations are not performed keeps the same value. Then, the Vt restoration of the reference cell is performed on the basis of the Vt distribution of the default area.

A description will now be given in sequence. First, all default cells of the memory array (default area) 113 are arranged to correspond to the reference cell R0. Then, after initial Vt setting of the reference cell R0 shown in FIG. 12B, a potential difference VtSR3 is provided for the word line SWL of the default cells of the memory array (default area) 113 and the word line RWL of the reference cell R0, a read operation is performed, and the result is stored in a file of a tester or a special nonvolatile memory area for each address, as shown in FIG. 13.

At the time of the Vt restoration, like after the initial Vt adjustment of the reference cell R0, as shown in FIG. 13, the potential difference VtSR3 is provided for the word line SWL of the default cells of the memory array (default area) 113 and the word line RWL of the reference cell R0, the read operation is performed on all default cells of the memory array (default area) 113, and then the write operation is performed until the result of the read operation matches with the stored 0/1 judgment result of the read operation when the initial Vt adjustment of the reference cell R0, such that the Vt restoration of the reference cell. As a method of checking whether or not the results match with each other, for example, as shown in FIG. 15, the result of the read operation when the initial Vt adjustment of the reference cell R0 is stored in the fail analysis memory 116, and then it is judged on the basis of an exclusive logical sum of the stored result and the result of the read operation at the time of the Vt restoration whether or not the results of two read operations match with each other.

Relatively speaking, like the case of FIG. 10B of the second embodiment, as shown in FIG. 14B, the write operation into the reference cell R0 is performed such that the Vt distribution of the default area having Vt apparently increased due to the Vt reduction of the reference cell R0 returns to the value at the time of initial Vt setting of the reference cell R0.

With this method, the Vt restoration of the reference cell R0 can be performed with high accuracy by using a plurality of default cells, without performing a complex measurement for examining cells in a specified range, as compared with the second embodiment.

Fourth Embodiment

Figure 16A:
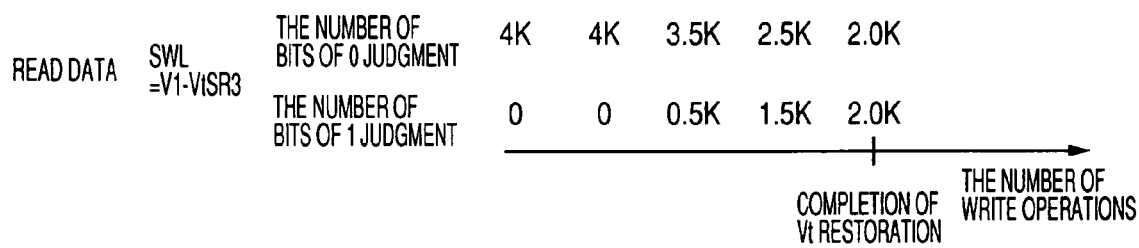
FIGS. 16A and 16B are a Vt restoration method according to a fourth embodiment of the invention.
Figure 16B:
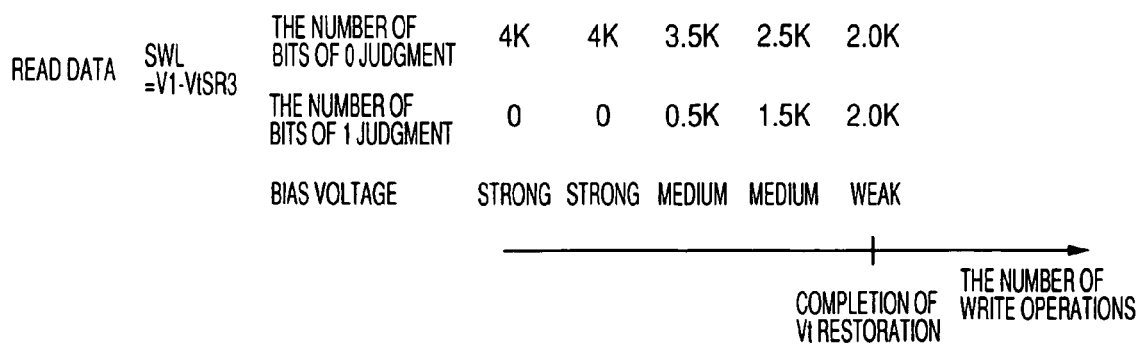

FIGS. 16A and 16B show a Vt restoration method according to a fourth embodiment of the invention. Moreover, the configuration is the same as that of the second embodiment, and thus the schematic view of the peripheral portion of the memory array and the circuit diagram of the inner parts of the blocks in the schematic view are the same as FIGS. 6 and 7 of the second embodiment, respectively. Further, the change of the Vt distribution during the inspection process is the same as the case of FIGS. 12A to 12C in the third embodiment.

With reference to FIG. 16, a description will now be given for the Vt restoration method of the reference cell by using a memory device according to the fourth embodiment of the invention. Like the third embodiment, the default cells of the default area 113 keep the initial states, without performing the write and erase operations during the inspection process. Therefore, as shown in FIGS. 12A to 12C, the Vt distribution 114 of the memory array (default area) 113 where the write and erase operations are not performed keeps the same value. Then, the Vt restoration of the reference cell is performed on the basis of the Vt distribution of the default area.

A description will now be given in sequence. First, all default cells of the memory array (default area) 113 are arranged to correspond to the reference cell R0. Then, after initial Vt setting of the reference cell R0 shown in FIG. 12B, the potential difference VtSR3 is provided for the word line SWL of the default cells of the memory array (default area) 113 and the word line RWL of the reference cell R0, the read operation is performed, and the number of cells of 0 and 1 judgment is examined from the result of the read operation, and then the number of cells is stored in a file of a tester or a special nonvolatile memory area, as shown in FIG. 13.

At the time of the Vt restoration, like after initial Vt setting of the reference cell R0, as shown in FIG. 13, the potential difference VtSR3 is provided for the word line SWL of the default cell of the memory array (default area) 113 and the word line RWL of the reference cell R0, the read operation is performed on all default cells of the memory array (default area) 113, and the write operation into the reference cell R0 is performed until the number of cells of the 0 and 1 judgment matches with the stored number of cells at the time of initial Vt setting of the reference cell R0, as shown in FIG. 16A, such that the Vt restoration of the reference cell is performed.

Further, as shown in FIG. 16B, if the bias voltage condition to be used for the write operation of the reference cell R0 is properly controlled according to the number of cells of the 0/1 judgment after initial Vt setting of the reference cell R0 and the number of cells of the 0/1 judgment at the time of the Vt restoration, the time required for the Vt restoration can be shortened, and thus the Vt restoration can be performed with increased accuracy. Specifically, when the difference in the number of cells of the 0/1 judgment is large, it can be understood that a difference with Vt after the initial Vt adjustment of the reference cell R0 is large. Accordingly, the write operation is performed under a high bias voltage condition such that a strong write operation is performed. Further, when the difference in the number of cells of the 0/1 judgment is small, it can be understood that the difference with Vt after the initial Vt adjustment of the reference cell R0 is small. Accordingly, the write operation is performed under a low bias voltage condition such that a weak write operation is performed. Therefore, the write operation into the reference cell R0 is completed with the Vt value close to the target.

With this method, a resource such as a memory for storing the 0/1 judgment results is not required, as compared with the third embodiment. Further, since the write operation condition of the reference cell is changed according to the change in the number of cells, the time required for the Vt restoration can be shortened, and thus the Vt restoration can be performed with high accuracy.

Fifth Embodiment

Figure 17:
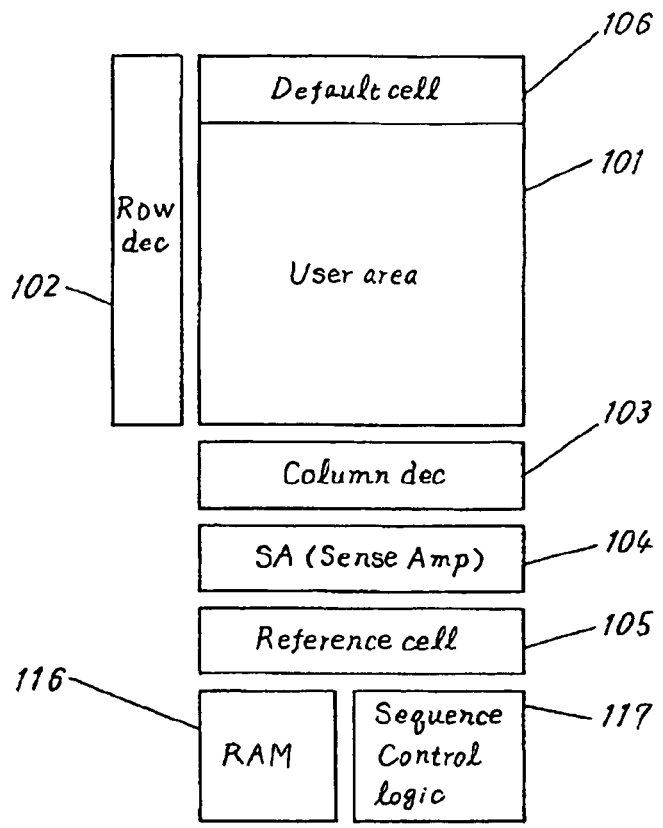
FIG. 17 is a block diagram of a memory cell array according to a fifth embodiment of the invention.

According to the above-described operations of the first to fourth embodiments, the verification operation is performed by using the sense amplifier SA inside the chip, without performing the verification by the measurement of the DC current. Accordingly, as shown in FIG. 17, a built-in sequencer circuit 117 is provided to control a series of operations such as the write operation into the fail analysis memory 116 or the reference cell R0 or the verification, thereby completing a series of operations inside the chip.

Further, as a specified example of the fail analysis memory 116, a nonvolatile memory such as SRAM or DRAM is used.

As such, with the completion of the operations inside the chip, the operations can be performed in short time, and the resource of the tester can be omitted, as compared with the control of the operations from the outside of the chip by the tester. Therefore, the inspection cost can be reduced.

Sixth Embodiment

Figure 18:
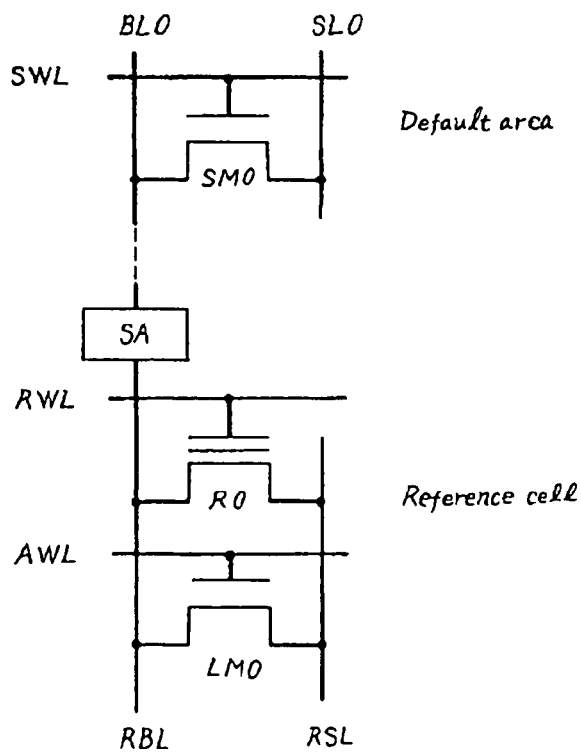
FIG. 18 is a diagram showing parts required for Vt setting of a reference cell according to a sixth embodiment of the invention.

According to the above-described operations of the first to fourth embodiments, the potentials applied to the word line RWL of the reference cell R0 and the word line SWL of the default cells SM0 to SMm are different from each other. This means that two power supply circuits are required, which causes an increase in chip area. In contrast, as shown in FIG. 18, an additional current circuit LM0 is provided on the bit line RBL of the reference cell R0. Then, as for the read operation in the third or fourth embodiment when the potential of the word line SWL of the default cells SM0 to SMm is set to be lower than the potential of the word line RWL of the reference cell R0, if a proper current flows in the additional current circuit LM0, the potentials of the two word lines RWL and SWL are made equal to each other, thereby performing the Vt restoration. Moreover, as the additional current circuit LM0, as shown in FIG. 18, a circuit having one NMOS transistor may be used, but other circuits may be used in order to flow a proper additional current. However, the condition of the additional current circuit needs to be set such that its characteristics are not changed due to thermal stress.

With this method, the potential difference does not need to be provided for the word lines, and thus the power supply circuit can be simplified.

As for the Vt restoration when the threshold of the reference cell is changed during the inspection process, the verification by the current measurement of the reference cell which requires the long inspection time can be eliminated, and write-back of the reference cell can be completed in short time. Therefore, the inspection time and the cost can be markedly reduced.

What is claimed is:

1. A semiconductor memory device, comprising:
   memory cells, each of which has a place for accumulating an electrostatic charge and which stores data according to a charge amount of the place accumulating the electrostatic charge;
   wherein a memory cell storing data according to a charge amount of a place accumulating an electrostatic charge is used as a first reference cell which generates a voltage or current to be a judgment reference when data is read out from each of the memory cells;
   a second reference cell which generates a voltage or current to be a judgment reference when data is read out from the first reference cell is provided; and
   a threshold of the first reference cell is changed on the basis of the voltage or current generated by the second reference cell,
   wherein a plurality of second reference cells are used; and
   wherein, when the read operations of the second reference cells are performed on the basis of the first reference cell, the threshold of the first reference cell is adjusted based on 0/1 judgment results for each second reference cell.

2. A semiconductor memory device, comprising:
memory cells, each of which has a place for accumulating an electrostatic charge and which stores data according to a charge amount of the place accumulating the electrostatic charge;
wherein a memory cell storing data according to a charge amount of a place accumulating an electrostatic charge is used as a first reference cell which generates a voltage or current to be a Judgment reference when data is read out from each of the memory cells;
a second reference cell which generates a voltage or current to be a judgment reference when data is read out from the first reference cell is provided; and
a threshold of the first reference cell is changed on the basis of the voltage or current generated by the second reference cell,
wherein a plurality of second reference cells is used; and
wherein, when the read operations of the second reference cells are performed on the basis of the first reference cell, the threshold of the first reference cell is adjusted based on the number of second reference cells of 0/1 judgment.

3. The semiconductor memory device according to claim 2,
wherein a memory cell which stores data according to a charge amount of a place accumulating an electrostatic charge is used as the second reference cell.

4. The semiconductor memory device according to claim 2,
wherein a bias voltage to be applied to the first reference cell is changed at the time of the change to the threshold of the first reference cell.

5. The semiconductor memory device according to claim 2, further comprising:
a control circuit, which controls a series of operations to be performed at the time of the change to the threshold of the first reference cell.

6. The semiconductor memory device according to claim 2, further comprising:
a circuit which applies a current to a bit line connected to the first reference cell at the time of the change to the threshold of the first reference cell.

* * * * *